(12) United States Patent
Shi et al.

(10) Patent No.: US 11,314,172 B2
(45) Date of Patent: Apr. 26, 2022

(54) INSTANT TUNING METHOD FOR ACCELERATING RESIST AND ETCH MODEL CALIBRATION

(71) Applicant: ASML NETHERLANDS B.V., Veldhoven (NL)

(72) Inventors: Hongfei Shi, Shenzhen (CN); Jinze Wang, Shenzhen (CN); Pengcheng Yang, Shenzhen (CN); Lei Wang, Los Gatos, CA (US); Mu Feng, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/977,137

(22) PCT Filed: Mar. 7, 2019

(86) PCT No.: PCT/EP2019/055691
§ 371 (c)(1),
(2) Date: Sep. 1, 2020

(87) PCT Pub. No.: WO2019/179782
PCT Pub. Date: Sep. 26, 2019

(65) Prior Publication Data
US 2021/0048751 A1   Feb. 18, 2021

Related U.S. Application Data

(60) Provisional application No. 62/645,756, filed on Mar. 20, 2018.

(51) Int. Cl.
*G03F 7/20* (2006.01)
(52) U.S. Cl.
CPC .......... *G03F 7/705* (2013.01); *G03F 7/70516* (2013.01); *G03F 7/70625* (2013.01)

(58) Field of Classification Search
CPC ... G03F 7/705; G03F 7/70516; G03F 7/70625
See application file for complete search history.

(56) References Cited

U.S. PATENT DOCUMENTS

| 2007/0032896 | A1 | 2/2007 | Ye et al. |
| 2009/0157577 | A1 | 6/2009 | Chauhan et al. |
| (Continued) | | | |

FOREIGN PATENT DOCUMENTS

WO    2018033363    2/2018

OTHER PUBLICATIONS

International Search Report and Written Opinion issued in corresponding PCT Patent Application No. PCT/EP2019/055691, dated May 21, 2019.

*Primary Examiner* — Peter B Kim
(74) *Attorney, Agent, or Firm* — Pillsbury Winthrop Shaw Pittman LLP (57) ABSTRACT

A method for accelerating calibration of a fabrication process model, the method including performing one or more iterations of: defining one or more fabrication process model terms; receiving predetermined information related to the one or more fabrication process model terms; generating a fabrication process model based on the predetermined information, the fabrication process model configured to generate one or more predictions related to a metrology gauge; determining whether a prediction related to a dimension of a gauge is within a predetermined threshold of the gauge as measured on a post-fabrication process substrate; and responsive to the prediction not breaching the predetermined threshold, optimizing the one or more fabrication process terms such that the prediction related to the dimension of the gauge is within the predetermined threshold of the gauge as measured on the post-fabrication process substrate.

20 Claims, 3 Drawing Sheets

(56) References Cited

U.S. PATENT DOCUMENTS

| | | |
|---|---|---|
| 2009/0182448 A1* | 7/2009 | Mansfield ........... G03F 7/70508 700/110 |
| 2009/0300573 A1 | 12/2009 | Cao et al. |
| 2010/0146475 A1 | 6/2010 | Cao et al. |
| 2013/0254725 A1 | 9/2013 | Parikh |
| 2016/0140278 A1 | 5/2016 | Deng et al. |
| 2018/0129140 A1 | 5/2018 | Cramer et al. |
| 2018/0364589 A1 | 12/2018 | Chen et al. |

* cited by examiner

INSTANT TUNING METHOD FOR ACCELERATING RESIST AND ETCH MODEL CALIBRATION

CROSS-REFERENCE TO RELATED APPLICATIONS

This application is the U.S. national phase of PCT Patent Application No. PCT/EP2019/055691, which was filed on Mar. 7, 2019, which claims the benefit of priority of U.S. patent application No. 62/645,756, which was filed on Mar. 20, 2018, which is incorporated herein in its entirety by reference.

FIELD

The present disclosure pertains to an instant tuning method for accelerating resist and etch model calibration.

DESCRIPTION OF THE RELATED ART

Lithographic apparatuses can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

As semiconductor manufacturing processes continue to advance, the dimensions of circuit elements have continually been reduced while the amount of functional elements, such as transistors, per device has been steadily increasing over decades, following a trend commonly referred to as "Moore's law". In order to ensure that the features are generated on a semiconductor substrate in accordance with the requirements of the given target circuit design, proximity effects need to be predicted utilizing sophisticated numerical models, and corrections or pre-distortions need to be applied to the design of the mask before successful manufacturing of high-end devices becomes possible. In a typical high-end design almost every feature edge requires some modification in order to achieve printed patterns that come sufficiently close to the target design. These modifications may include shifting or biasing of edge positions or line widths as well as application of "sub-resolution assist" features that are not intended to print themselves, but will affect the properties of an associated primary feature.

The application of model-based OPC to a target design requires good process models and considerable computational resources, given the many millions of features typically present in a chip design. The OPC is essentially a very large optimization problem. In the general case, there is no closed-form solution to this problem, and OPC vendors use an approximate, iterative process that does not always resolve all possible weaknesses on a layout.

OPC requires robust models that describe the lithography process precisely. Calibration procedures for such lithography models are thus required that provide models being valid, robust and accurate across the process window. Currently, calibration is done using a certain number of 1-dimensional and/or 2-dimensional gauge patterns with wafer measurements. More specifically, those 1-dimensional gauge patterns include, but are not limited to, line-space patterns with varying pitch and CD, isolated lines, multiple lines, etc. and the 2-dimensional gauge patterns typically include line-ends, contacts, and randomly selected SRAM (Static Random Access Memory) patterns. Those skilled in the arts will understand that the present disclosure is generic enough to accommodate any type of pattern. These patterns are then imaged onto a wafer and resulting wafer CDs and/or contact energy are measured. The original gauge patterns and their wafer measurements are then used jointly to determine the model parameters which minimize the difference between model predictions and wafer measurements.

In current practice, resist model calibration tasks include resist template selection and model fine tuning. A resist template includes the resist terms applicable to a particular pattern and process. Due to the presence of a vast parameter space, duration for template selection may include extended periods of time prior to identification of the best template. Additionally, model tuning may provide an even larger time burden (e.g., one or more days) due to the iterative process for resist term tuning. Furthermore, because of the heavy computation load, the calibration task is wrapped as individual jobs and submitted to server cluster. A resist calibration job requires the calculation of resist term signals prior to generating a resist model and checking the model's performance. The signal calculation may be time consuming. The time burden of resist signal calculation increases linearly with gauge number, and jobs may not share signals with one another. The same signal may have been calculated many times during a calibration loop. In addition, submission of jobs to the server may require extended periods of time depending on network communication. Such drawbacks may cause long runtime in resist template selection and long turnaround time in resist model fine tune. Accordingly, a need exists to address these and other shortfalls of the traditional methods.

SUMMARY

The present disclosure provides a number of innovations in the area of resist and etch model calibration that may relate to the issues mentioned above, among others. In an embodiment, methods as described herein may provide a way to calibrate resist and/or etch models in which a resist and/or an etch parameter space is sampled in reasonable runtime and memory space.

Though discussed in terms of resist models, various embodiments may find application to parameters from a variety of models, including the etch model and/or other models.

Embodiments of the present disclosure describe a method for accelerating calibration of a fabrication process model, the method comprising performing one or more iterations of the following operations until a prediction by the fabrication process model related to a dimension of a metrology gauge is within a predetermined threshold of the metrology gauge as measured on a post-fabrication process wafer: defining one or more fabrication process model terms; receiving predetermined information related to the one or more fabrication process model terms; generating the fabrication process model based on the predetermined information, the fabrication process model configured to generate one or more predictions related to the metrology gauge; and determining whether a prediction related to a dimension of the metrology gauge is within a predetermined threshold of the gauge as measured on a post-fabrication process wafer.

These and other objects, features, and characteristics of the present disclosure, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the disclosure.

DETAILED DESCRIPTION OF THE EXEMPLARY EMBODIMENTS

Before describing embodiments in detail, it is instructive to present an example environment in which embodiments may be implemented.

Figure 1:
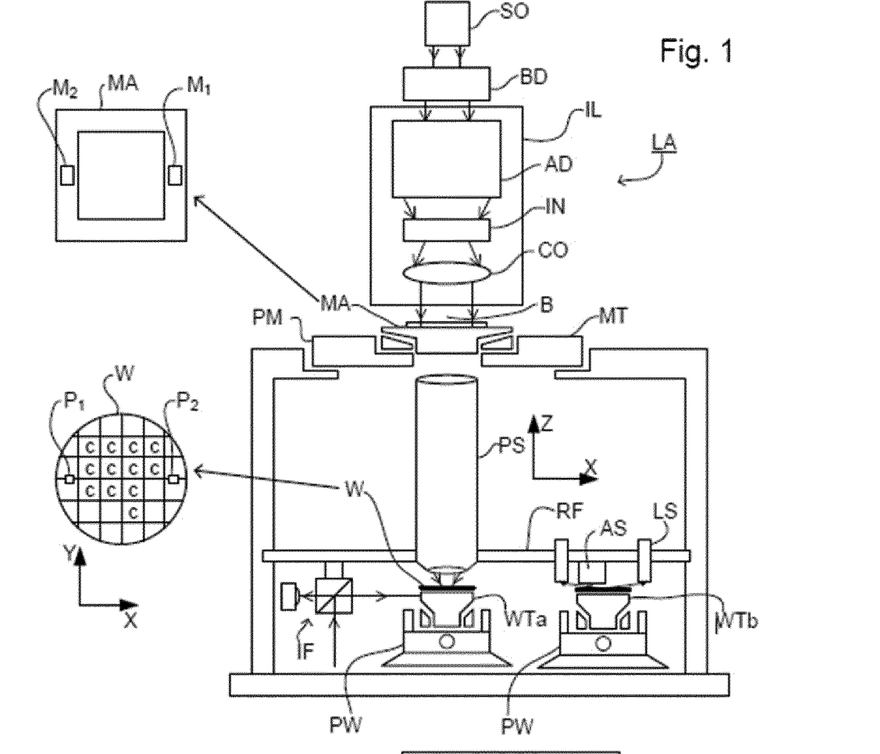
FIG. 1 is an illustrative diagram of an exemplary lithographic apparatus, in accordance with one or more embodiments.

FIG. 1 is an illustrative diagram of an exemplary lithographic apparatus, in accordance with one or more embodiments. The apparatus may include:

an illumination system (illuminator) IL configured to condition a radiation beam B (e.g., DUV radiation or EUV radiation);

a support structure (e.g., a mask table) MT constructed to support a patterning device (e.g., a mask) MA and connected to a first positioner PM configured to accurately position the patterning device MA in accordance with certain parameters;

a substrate table (e.g., a wafer table) WTa constructed to hold a substrate (e.g., a resist coated wafer) W and connected to a second positioner PW configured to accurately position the substrate W in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support structure, in one embodiment, holds the patterning device in a manner that depends on the orientation of the patterning device, the design of the lithographic apparatus, and other conditions, such as, for example, whether or not the patterning device is held in a vacuum environment. The patterning device support structure can use mechanical, vacuum, electrostatic or other clamping techniques to hold the patterning device. The patterning device support structure may be a frame or a table, for example, which may be fixed or movable as required. The patterning device support structure may ensure that the patterning device is at a desired position, for example, with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and may include mask types such as binary, alternating phase-shift, and attenuated phase-shift, as well as various hybrid mask types. An example of a programmable mirror array employs a matrix arrangement of small mirrors, each of which can be individually tilted to reflect an incoming radiation beam in different directions. The tilted mirrors may impart a pattern in a radiation beam, which is reflected by the mirror matrix.

The term "projection system" used herein should be broadly interpreted as encompassing any type of projection system, including, but not limited to, refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As depicted herein, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more tables (e.g., two or more substrate table, two or more patterning device support structures, or a substrate table and metrology table). In such "multiple stage" machines, the additional tables may be used in parallel, or preparatory steps may be carried out on one or more tables while one or more other tables are being used for pattern transfer.

The lithographic apparatus may also be of a type where at least a portion of the substrate may be covered by a liquid having a relatively high refractive index (e.g., water), to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL may receive a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases, however, the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator IL may be used to condition the radiation beam such that the beam may have a desired uniformity and intensity distribution in its cross section.

The radiation beam B, in one embodiment, is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2 D encoder, or capacitive sensor), the substrate table WTa can be moved accurately, e.g., to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WTa may be realized using a long-stroke module and a short-stroke module, which may form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it may be desirable that the markers be as small as possible and not require any different patterning or other process conditions than adjacent features. An exemplary embodiment of an alignment system, which detects the alignment markers, is described further below.

The depicted apparatus could be used in at least one of the following modes:

In step mode, the patterning device support (e.g., mask table) MT and the substrate table WTa are kept essentially stationary, while an entire pattern imparted to the radiation beam is projected onto a target portion C at one time (e.g., a single static exposure). The substrate table WTa may then be shifted in the X and/or Y direction so that a different target portion C can be exposed. In step mode, the maximum size of the exposure field limits the size of the target portion C imaged in a single static exposure.

In scan mode, the patterning device support (e.g., mask table) MT and the substrate table WTa are scanned synchronously while a pattern imparted to the radiation beam is projected onto a target portion C (e.g., a single dynamic exposure). The velocity and direction of the substrate table WTa relative to the patterning device support (e.g., mask table) MT may be determined by the (de)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the patterning device support (e.g., mask table) MT is kept essentially stationary holding a programmable patterning device, and the substrate table WTa is moved or scanned while a pattern imparted to the radiation beam is projected onto a target portion C. In this mode, generally, a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

Lithographic apparatus LA is of a so-called dual stage type, which has two tables WTa, WTb (e.g., two substrate tables), and two stations—an exposure station and a measurement station—between which the tables can be exchanged. For example, while a substrate on one table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS, both sensors being supported by a reference frame RF. If the position sensor IF is not capable of measuring the position of a table while it is at the measurement station as well as at the exposure station, a second position sensor may be provided to enable the positions of the table to be tracked at both stations. As another example, while a substrate on one table is being exposed at the exposure station, another table without a substrate waits at the measurement station (where optionally measurement activity may occur). This other table has one or more measurement devices and may optionally have other tools (e.g., cleaning apparatus). When the substrate has completed exposure, the table without a substrate moves to the exposure station to perform, e.g., measurements and the table with the substrate moves to a location (e.g., the measurement station) where the substrate is unloaded and another substrate is load. These multi-table arrangements enable a substantial increase in the throughput of the apparatus.

Figure 2:
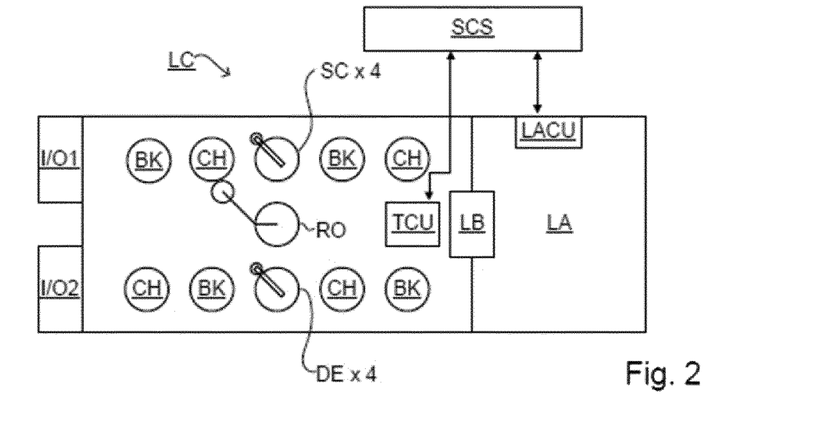
FIG. 2 is an illustrative diagram of an exemplary lithographic cell or cluster, in accordance with one or more embodiments

FIG. 2 is an illustrative diagram of an exemplary lithographic cell or cluster, in accordance with one or more embodiments. As shown in FIG. 2, a lithographic apparatus LA may form part of a lithographic cell LC, also sometimes referred to as a lithocell or lithocluster, which also may include, in some embodiments, an apparatus to perform one or more pre- and post-pattern transfer processes on a substrate. Conventionally these include one or more spin coaters SC to deposit a resist layer, one or more developers DE to develop patterned resist, one or more chill plates CH, and one or more bake plates BK. A substrate handler, or robot, RO may pick up a substrate from input/output ports I/O1, I/O2, and may move it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

To enable that the substrate that is processed (e.g., exposed) by the patterning process is processed correctly and consistently, it is desirable to inspect a processed substrate to measure one or more properties such as overlay error between subsequent layers, line thickness, critical dimension (CD), etc. If an error is detected, an adjustment may be made to the patterning process, e.g., in terms of changing a design of, or changing a tool for designing, the patterning process, controlling an executing patterning process, etc.

An inspection apparatus can be used for such measurement. An inspection apparatus is used to determine one or more properties of a substrate, and in particular, how one or more properties of different substrates or different layers of the same substrate vary from layer to layer and/or across a substrate and/or across different substrates, e.g., from substrate to substrate. The inspection apparatus may be integrated into the lithographic apparatus LA or the lithocell LC or may be a stand-alone device.

An inspection apparatus to determine one or more properties of a substrate can take various different forms. For example, the inspection apparatus may use photon electromagnetic radiation to illuminate the substrate and detect radiation redirected by the substrate; such inspection apparatuses may be referred to as bright-field inspection apparatuses. A bright-field inspection apparatus may use radiation with a wavelength in, for example, the range of 150-900 nm. The inspection apparatus may be image-based, i.e., taking an image of the substrate, and/or diffraction-based, i.e., measuring intensity of diffracted radiation. The inspection apparatus may inspect product features (e.g., features of an integrated circuit to be formed using the substrate or features of a mask) and/or inspect specific measurement targets (e.g., overlay targets, focus/dose targets, CD gauge patterns, etc.).

Inspection of, e.g., semiconductor wafers is often done with optics-based sub-resolution tools (bright-field inspection). However, in some cases, certain features to be measured are too small to be effectively measured using bright-field inspection. For example, bright-field inspection of defects in features of a semiconductor device can be challenging. Moreover, as time progresses, features that are being made using patterning processes (e.g., semiconductor features made using lithography) are becoming smaller and in many cases, the density of features is also increasing. Accordingly, a higher resolution inspection technique is used and desired. An example inspection technique is electron beam inspection. Electron beam inspection involves focusing a beam of electrons on a small spot on the substrate to be inspected. An image is formed by providing relative movement between the beam and the substrate (hereinafter referred to as scanning the electron beam) over the area of the substrate inspected and collecting secondary and/or backscattered electrons with an electron detector. The image data is then processed to, for example, identify defects.

In some embodiments, a resist model describes the effects of chemical processes which occur during resist exposure, PEB and development, in order to predict, for example, contours of resist features formed on the substrate wafer. The objective of the simulation is to accurately predict, for example, edge placements and CDs, which can then be compared against a target design. In general, the connection between the optical and the resist model is a simulated aerial image within the resist layer, which arises from the projection of light onto the substrate, refraction at the resist interface and multiple reflections in the resist film stack. During a resist model development/simulation, the light intensity distribution (aerial image) is turned into a simulated latent "resist image" by simulating the absorption of photons, which is further modified by diffusion processes and various loading effects. Traditionally, a resist model is determined and calibrated by obtaining an actual aerial image and processing, via one or more algorithms and filters, the aerial image to determine one or more resist terms. For example, a Gaussian filter may be applied to the aerial image to obtain the acid distribution (e.g., acid diffusion). Such a transform results in an image having bright and dark sections that correspond to resist lines and resist trenches. The resultant image may be referred to as a resist signal that describes one or more physical and/or chemical characteristics of the resist. As an example, the dark sections may be indicative of resist lines and the bright sections may be indicative of resist trenches. In some embodiments, the resist model predicts which parts of the resist will be developed and which parts will remain post development.

The present inventors recognize that during a resist model calibration one or more resist signals may be recalculated due to the iterative nature of the calibration. Moreover, current systems may not facilitate storage of resist signals for subsequent access and analysis. For example, subsequent to completion of a resist model calibration, the calculated resist signals may not be saved in a database.

The present inventors have identified an approach that alone or in various combinations would be capable of storing resist signals in a database such that future processes having similar optical settings are modeled using the saved signals. In this way, for example, the model calibration complexity may be reduced (e.g., a linear optimization rather than complex and repetitive mathematical transforms).

In some embodiments, the resist image (RI) in an (x,y) plane within the resist layer is represented by:

$$RI(x, y) = \sum_{i=1}^{N} c_i T_i^{\sigma_i}(x, y) \qquad \text{(Eq. 1)}$$

In some embodiments, one or more of the model parameters corresponds to a distinct physical or chemical effect. In some embodiments, the model formulation may set bounds or constraints on how well the calibrated model can describe the reality. The resist model of Equation 1 is a linear sum of N terms, each weighted with a linear coefficient $c_i$. The terms may have some non-linear coefficient, here denoted as $\sigma_i$, which may be for example the standard deviation of a Gaussian vector. As shown in Equation 1, term 'T' describes a specific physical process, reaction, or change that has occurred in the resist (e.g., reaction, diffusion or quenching of acid and alkaline). In some embodiments, term '$\sigma_i$' denotes a spatial range in which the specific process happens. In some embodiments, $\sigma_i$ depends on the post bake time and temperature. In some embodiments, $\sigma_i$ may vary among the one or more resist model terms. In some embodiments, (best) values of $\sigma_i$ may be determined through one or more optimization methods including simplex or other optimization methods. By way of a non-limiting example, the resist image may be represented by an information matrix in the following form:

$$\begin{bmatrix} T_1^{\sigma=10}(x_1) & \ldots & T_N^{\sigma=10}(x_1) & T_1^{\sigma=20}(x_1) & \ldots & T_N^{\sigma=20}(x_1) & \ldots & T_1^{\sigma=100}(x_1) & \ldots & T_N^{\sigma=100}(x_1) \\ T_1^{\sigma=10}(x_2) & \ldots & T_N^{\sigma=10}(x_2) & T_1^{\sigma=20}(x_2) & \ldots & T_N^{\sigma=20}(x_2) & \ldots & T_1^{\sigma=100}(x_2) & \ldots & T_N^{\sigma=100}(x_2) \\ \vdots & & \vdots & \vdots & & \vdots & & \vdots & & \vdots \\ T_1^{\sigma=10}(x_K) & \ldots & T_N^{\sigma=10}(x_K) & T_1^{\sigma=20}(x_K) & \ldots & T_N^{\sigma=20}(x_K) & \ldots & T_1^{\sigma=100}(x_K) & \ldots & T_N^{\sigma=100}(x_K) \end{bmatrix}$$

Each row corresponds to a test pattern (k=1 to K) from an initial larger set of test patterns, and $x_k$ is the location of edge for test pattern k on the wafer. Here the 2-dimensional plane ($x_k, y_k$) is expressed as just $x_k$ for simplicity. There are N terms in the resist model, and each term is represented with a column. These N columns are then repeated for each of the non-linear coefficients. In the above example, $\sigma$=10 to 100, in steps of 10; but any value and step for $\sigma$ can be used. The nominal range of values of $c_i$ and $\sigma_i$ should match the intended range for the calibration.

Figure 3:
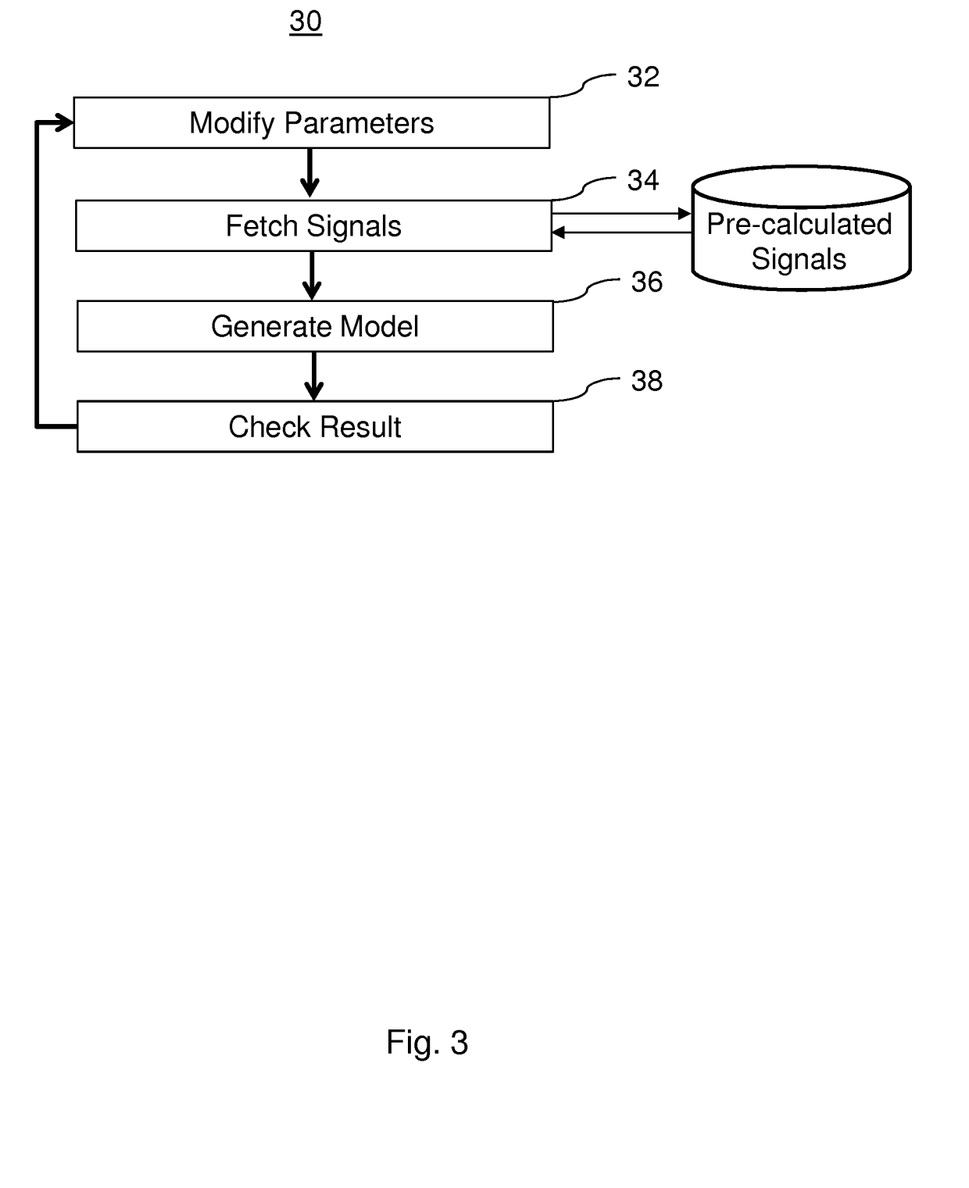
FIG. 3 is a flowchart illustrating example methods of accelerating resist model calibration, in accordance with one or more embodiments.

FIG. 3 illustrates a method 30 for accelerating resist model calibration, in accordance with one or more embodiments. The operations of method 30 presented below are intended to be illustrative. In some embodiments, method 30 may be accomplished with one or more additional operations not described, and/or without one or more of the operations discussed. Additionally, the order in which the operations of method 30 are illustrated in FIG. 3 and described below is not intended to be limiting.

At an operation 32, the method commences by (i) defining one or more fabrication process model terms (e.g., resist terms, etch terms) and (ii) obtaining one or more of initial values and/or applicable ranges of a standard deviation ($\sigma$ value) of a Gaussian distribution. In one use-case scenario, the method may commence by (i) defining one or more resist model terms and (ii) obtaining one or more of initial values and/or applicable ranges of a standard deviation ($\sigma$) of a Gaussian distribution. In some embodiments, defining the one or more resist model terms includes selecting or modifying one or more parameters (e.g., variables) corresponding to one or more physical and/or chemical characteristics of the resist. For example, a given resist model may be defined via model terms describing acid distribution, loading, and/or other model terms. In some embodiments, one or more the model terms are added to or removed from the resist model such that the resist model more accurately predicts a metrology gauge. In some embodiments, the one or more defined resist model terms include a predetermined set of resist model terms (e.g., resist model terms A, B, and C may be automatically selected for any given resist model). In some embodiments, the one or more resist model terms are defined based on one or more properties of the resist (e.g., physical or chemical properties), lithography (e.g., wavelength, exposure time, etc.), or other properties. In some embodiments, the one or more resist model terms are defined to determine the effect of the one or more resist model terms on the prediction output by the resist model. The obtained $\sigma$ value is used for the determination of the resist terms (described below). In some embodiments, the initial values for the standard deviation may be 20 nm, 30 nm, 50 nm, and/or other values. In some embodiments, applicable ranges for the $\sigma$ values include values between 30 nm and 200 nm. In some embodiments, the $\sigma$ value intervals are predetermined. In some embodiments, responsive to the intervals being larger than a predetermined threshold, the resist terms are interpolated for $\sigma$ values between the selected $\sigma$ intervals. In some embodiments, with respect to an etch model, the method commences by (i) defining one or more etch model terms and (ii) obtaining one or more of initial values and/or applicable ranges of a standard deviation ($\sigma$) of a Gaussian distribution (e.g., same as or similar to operation 32 described above).

At an operation 34, the method proceeds by receiving predetermined information related to the one or more fabrication process model terms. In some embodiments, the predetermined information comprises one or more pre-calculated signals conveying information related to the one or more fabrication process model terms. For example, the method may proceed by receiving predetermined information related to the one or more resist model terms. In some embodiments, the predetermined information comprises one or more pre-calculated signals conveying information related to the one or more resist model terms. In some embodiments, each resist model term is a two-dimensional image generated from the aerial image. In some embodiments, an individual resist signal includes the image intensity at one or more gauge locations (e.g., at one or more critical dimensions
(CD) of a circuit), the intensity being a floating point value between 0 and 1. In some embodiments, the signal includes an intensity of a resist term (e.g., image intensity) with respect to a gauge (e.g., at a CD location). In some embodiments, the pre-calculated signals are obtained by transforming, via one or more Gaussian filters, the aerial image such that a resist image is obtained. In some embodiments, the predetermined information (e.g., the one or more pre-calculated signals) comprises a predetermined Gaussian blur applied to the standard deviation of the Gaussian vector (e.g., for the one or more resist terms). Due to the iterative nature of this process, the multiple resist signals may be pre-calculated simultaneously (e.g., parallel computing, multi-threading, etc.). In some embodiments, with respect to an etch model, the method proceed by receiving predetermined information related to the one or more etch model terms (e.g., same as or similar to operation 34 described above).

At an operation 36, the method proceeds by generating a fabrication process model (e.g., resist model, etch model) (e.g., Eq. 1) based on the predetermined information (e.g., the one or more pre-calculated signals). For example, with respect to a resist model, the method proceed by generating a resist model based on the predetermined information. In this operation, fabrication process model terms (e.g., resist model terms, etch model terms) are assigned their respective coefficients. In some embodiments, the fabrication process model (e.g., resist model, etch model) is configured to generate one or more predictions related to a metrology gauge. In some embodiments, with respect to an etch model, the method proceed by generating an etch model based on the predetermined information (e.g., same as or similar to operation 36 described above).

Traditionally, two images (e.g., an image for a first resist term and an image for a second resist term) had to be multiplied (e.g., point by point/ pixel by pixel) together to determine a cross term effect, as the new cross term constitutes a new term requiring a new image. In contrast, in operation 36, generating the fabrication process model (e.g., resist model, etch model) comprises determining an effect caused by a cross contribution of two or more fabrication process model terms by determining a product of the two or more fabrication process model terms. For example, in operation 36, generating the resist model may include determining an effect caused by a cross contribution of two or more resist terms by determining a product of the two or more resist terms. In this example, determining a cross contribution of loading and acid distribution in the resist comprises determining a product of resist terms corresponding to the loading and the acid distribution.

At an operation 38, the method proceeds by determining whether a prediction related to a dimension of a metrology gauge is within a predetermined threshold of the metrology gauge as previously measured on a post-fabrication process wafer. In one use-case scenario, the method may proceed by determining whether a prediction related to a dimension of a gauge is within a predetermined threshold of the gauge as measured on a (physical) post-develop resist. In some embodiments, prior to such determination, one or more measurements related to one or more dimensions of the metrology gauges of the physical post-develop resist are obtained. In some embodiments, responsive to the prediction not breaching the predetermined threshold, the method proceeds by optimizing the one or more resist terms such that the prediction related to the dimension of the gauge is within the predetermined threshold of the gauge as measured on the post-develop resist. In this operation, a regression (e.g., least squares, etc.) between predicted gauge measurements and actual gauge measurements is executed. In the regression, there may be one or more residuals that are the deviations of the predicted gauge measurements from the actual gauge measurements sample mean (e.g., the model may be accurate for 80% of the gauges and inaccurate for the remaining 20% of the gauges). In some embodiments, responsive to the residuals exceeding a predetermined limit, operations 32 through 38 may be repeated until the residuals (e.g., residual error) are below the predetermined limit. For example, responsive to the residual error being greater than the predetermined limit, a new Gaussian blur σ value is selected. In some embodiments, with respect to an etch model, the method proceed by determining whether a prediction related to a dimension of a gauge is within a predetermined threshold of the gauge as measured on a (physical) post-etch wafer (e.g., same as or similar to operation 38 described above).

In some embodiments, operation 38 further includes fine tuning the resist model in which one or more resist terms are added and/or removed from the model in order to reduce the residual error. In some embodiments, with respect to an etch model, the method further includes fine tuning the etch model in which one or more etch terms are added and/or removed from the model in order to reduce the residual error.

In some embodiments, operation 38 further includes determining a particular fabrication process term (e.g., a resist model term, an etch model term) of the one or more fabrication process model terms that is more heavily weighted in the fabrication process model than the remaining fabrication process terms of the one or more fabrication process model terms. In a use-case scenario, operation 38 includes determining a particular resist term that is more heavily weighted in the resist model. For example, operation 38 may include determining which resist terms most closely resemble/describe a defect. In some embodiments, operation 38 further comprises determining one or more effects caused by one or more different fabrication process models (e.g., resist models, etch models). In some embodiments, the determination includes determining which effects commonly express prominence (e.g., more heavily weighted) within each of the one or more different fabrication process models (e.g., resist models, etch models). For example, the method may facilitate determining information related to resist shrinkage. In this example, an effect of resist shrinkage may be more heavily weighted than other effects among a plurality of resist models.

In some embodiments, the gauge corresponding to the predetermined metrology measurement includes a unique identification parameter. In some embodiments, the unique identification parameter is determined based on a fabrication process pattern (e.g., resist pattern, etch pattern) and a predetermined fabrication processing ambit. In some embodiments, the unique identification parameter is determined based on a resist pattern and a predetermined resist processing ambit (e.g., within a 1.3 micron radius of a particular gauge and/or pattern). In some embodiments, resist model optimizations corresponding to the unique identification parameter are stored in a database.

In some embodiments, method 30 further comprises determining whether a unique identification parameter corresponding to a gauge of a given fabrication process pattern (e.g., resist pattern, etch pattern) exists in the database. In some embodiments, responsive to the unique identification parameter corresponding to the gauge of the given fabrication process pattern (e.g., resist pattern, etch pattern) being present in the database, the method proceeds by generating the fabrication process model (e.g., resist model, etch model) corresponding to the unique identification parameter.

In some embodiments, method 30 comprises performing one or more iterations of operations 32-38 and/or other operations until a prediction by the resist model related to a dimension of a metrology gauge is within a predetermined threshold of the metrology gauge as measured on a post-develop resist.

Figure 4:
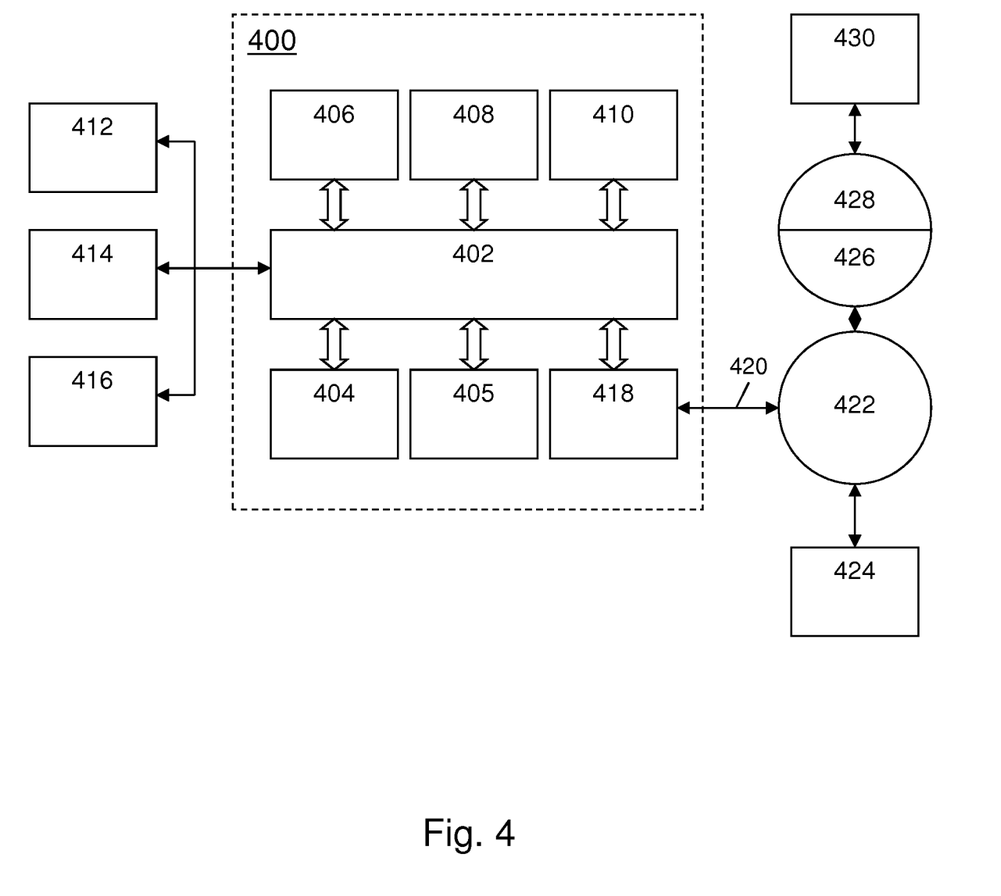
FIG. 4 is a block diagram of an example computer system in which embodiments can be implemented.

FIG. 4 is an exemplary block diagram that illustrates a computer system 300 which can assist in embodying and/or implementing the resist model calibration method disclosed herein. Computer system 400 includes a bus 402 or other communication mechanism for communicating information, and one or more processor(s) 404 (and 405) coupled with bus 402 for processing information. Computer system 400 also includes a main memory 406, such as a random access memory (RAM) or other dynamic storage device, coupled to bus 402 for storing information and instructions to be executed by processor 404. Main memory 406 also may be used for storing temporary variables or other intermediate information during execution of instructions to be executed by processor 404. Computer system 400 further includes a read only memory (ROM) 408 or other static storage device coupled to bus 402 for storing static information and instructions for processor 404. A storage device 410, such as a magnetic disk or optical disk, is provided and coupled to bus 402 for storing information and instructions.

Computer system 400 may be coupled via bus 402 to a display 412, such as a cathode ray tube (CRT) or flat panel or touch panel display for displaying information to a computer user. An input device 414, including alphanumeric and other keys, is coupled to bus 102 for communicating information and command selections to processor 404. Another type of user input device is cursor control 416, such as a mouse, a trackball, or cursor direction keys for communicating direction information and command selections to processor 404 and for controlling cursor movement on display 412. This input device typically has two degrees of freedom in two axes, a first axis (e.g., x) and a second axis (e.g., y), that allows the device to specify positions in a plane. A touch panel (screen) display may also be used as an input device.

In some embodiments, portions of the resist model calibration process may be performed by computer system 400 in response to processor 404 executing one or more sequences of one or more instructions contained in main memory 406. Such instructions may be read into main memory 406 from another computer-readable medium, such as storage device 410. Execution of the sequences of instructions contained in main memory 406 causes processor 404 to perform the process steps described herein. One or more processors in a multi-processing arrangement may also be employed to execute the sequences of instructions contained in main memory 406. In some embodiments, hard-wired circuitry may be used in place of or in combination with software instructions to implement the methods described herein. Thus, the embodiments are not limited to any specific combination of hardware circuitry and software.

The embodiments may further be described using the following clauses:

1. A method for accelerating calibration of a fabrication process model, the method comprising performing one or more iterations of the following operations until a prediction by the fabrication process model related to a dimension of a metrology gauge is within a predetermined threshold of the metrology gauge as measured on a post-fabrication process wafer:
defining one or more fabrication process model terms;
receiving predetermined information related to the one or more fabrication process model terms;
generating the fabrication process model based on the predetermined information, the fabrication process model configured to generate one or more predictions related to the metrology gauge; and
determining whether a prediction related to a dimension of the metrology gauge is within a predetermined threshold of the metrology gauge as previously measured on a post-fabrication process wafer.

2. The method of clause 1, wherein the fabrication process model comprises a resist model.

3. The method of clause 2, further comprising determining whether the prediction related to the dimension of the metrology gauge is within a predetermined threshold of the metrology gauge as previously measured on a post-develop resist.

4. The method of clause 1, wherein the fabrication process model comprises an etch model.

5. The method of clause 1, wherein individual ones of the one or more fabrication process model terms comprise a coefficient corresponding to a standard deviation of a Gaussian vector, and wherein the predetermined information comprises a predetermined Gaussian blur applied to the standard deviation of the Gaussian vector.

6. The method of clause 1, further comprising determining an effect caused by a cross contribution of two or more fabrication process model terms by determining a product of the two or more fabrication process model terms.

7. The method of clause 6, wherein the fabrication process model comprises a resist model, wherein the resist model terms comprise loading and acid distribution in the resist, and wherein determining a cross contribution of loading and acid distribution in the resist comprises determining a product of resist model terms corresponding to the loading and the acid distribution.

8. The method of clause 1, wherein the metrology gauge corresponding to the predetermined metrology measurement includes a unique identification parameter, wherein the unique identification parameter is determined based on a fabrication process pattern and a predetermined fabrication processing ambit, wherein fabrication process model optimizations corresponding to the unique identification parameter are stored in a database, and wherein the method further comprises:
determining whether a unique identification parameter corresponding to a gauge of a given fabrication process pattern exists in the database; and
responsive to the unique identification parameter corresponding to the gauge of the given fabrication process pattern being present in the database, generating the fabrication process model corresponding to the unique identification parameter.

9. The method of clause 1, further comprising determining a particular fabrication process term of the one or more fabrication process model terms that is more heavily weighted in the fabrication process model than the remaining fabrication process terms of the one or more fabrication process model terms.

10. The method of clause 1, further comprising determining one or more effects caused by one or more different fabrication process models, the determination including determining which effects commonly express prominence within each of the one or more different fabrication process models.
11. The method of clause 10, wherein the fabrication process model comprises a resists model, and wherein the effect caused by one or more different resist models includes resist shrinkage.
12. A computer program product comprising one or more computer-readable storage media having computer-executable instructions for causing a computer to select test patterns for calibrating a computational lithography model, the instructions causing the computer to perform the method of clause 1.
13. A system for accelerating calibration of a fabrication process model, the system comprising: one or more processors configured by machine-readable instructions to perform one or more iterations of the following operations until a prediction by the fabrication process model related to a dimension of a metrology gauge is within a predetermined threshold of the metrology gauge as measured on a post-fabrication process wafer:
define one or more fabrication process model terms;
receive predetermined information related to the one or more fabrication process model terms;
generate the fabrication process model based on the predetermined information, the fabrication process model configured to generate one or more predictions related to the metrology gauge; and determine whether a prediction related to a dimension of the metrology gauge is within a predetermined threshold of the metrology gauge as previously measured on a post-fabrication process wafer.
14. A method for accelerating calibration of a resist model, the method comprising performing one or more iterations of the following operations until a prediction by the resist model related to a dimension of a metrology gauge is within a predetermined threshold of the metrology gauge as measured on a post-develop resist:
defining one or more resist model terms;
receiving predetermined information related to the one or more resist model terms;
generating the resist model based on the predetermined information, the resist model configured to generate one or more predictions related to the metrology gauge; and
determining whether a prediction related to a dimension of the metrology gauge is within a predetermined threshold of the gauge as previously measured on a post-develop resist.
15. The method of clause 14, wherein individual ones of the one or more resist model terms comprise a coefficient corresponding to a standard deviation of a Gaussian vector, and wherein the predetermined information comprises a predetermined Gaussian blur applied to the standard deviation of the Gaussian vector.
16. The method of clause 14, further comprising determining an effect caused by a cross contribution of two or more resist terms by determining a product of the two or more resist terms.
17. The method of clause 16, wherein the two or more resist terms comprise loading and acid distribution in the resist, and wherein determining a cross contribution of loading and acid distribution in the resist comprises determining a product of resist terms corresponding to the loading and the acid distribution.
18. The method of clause 14, wherein the metrology gauge corresponding to the predetermined metrology measurement includes a unique identification parameter, wherein the unique identification parameter is determined based on a resist pattern and a predetermined resist processing ambit,
wherein resist model optimizations corresponding to the unique identification parameter are stored in a database, and wherein the method further comprises:
determining whether a unique identification parameter corresponding to a gauge of a given resist pattern exists in the database; and
responsive to the unique identification parameter corresponding to the gauge of the given resist pattern being present in the database, generating the resist model corresponding to the unique identification parameter.
19. The method of clause 14, further comprising determining a particular resist term of the one or more resist model terms that is more heavily weighted in the resist model than the remaining resist terms of the one or more resist model terms.
20. The method of clause 14, further comprising determining one or more effects caused by one or more different resist models, the determination including determining which effects commonly express prominence within each of the one or more different resist models.
21. The method of clause 20, wherein the effect caused by the one or more different resist models includes resist shrinkage.
22. The method of clause 14, wherein the predetermined information comprises pre-calculated signals indicative of one or more physical and/or chemical characteristics of the resist.
23. The method of clause 22, wherein the pre-calculated signals are stored in a database.
24. The method of clause 23, wherein generating the resist model comprises retrieving pre-calculated signals corresponding to the one or more resist model terms from the database.
25. The method of clause 22, wherein the pre-calculated signals are determined based on one or more filters being applied to an aerial image of the post-develop resist.
26. The method of clause 25, wherein the one or more filters include a Gaussian filter.
27. The method of clause 25, wherein an individual pre-calculated resist signal includes an image intensity at one or more metrology gauge locations.
28. The method of clause 14, wherein responsive to the prediction related to the dimension of the metrology gauge not being within the predetermined threshold of the gauge as previously measured on the post-develop resist, the one or more resist model terms are adjusted and further predetermined information related to the adjusted one or more resist model terms is obtained.

The term "computer-readable medium" as used herein refers to any medium that participates in providing instructions to processor 404 for execution. Such a medium may take many forms, including but not limited to, non-volatile media, volatile media, and transmission media. Non-volatile media include, for example, optical or magnetic disks, such as storage device 410. Volatile media include dynamic memory, such as main memory 406. Transmission media include coaxial cables, copper wire and fiber optics, including the wires that comprise bus 402. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 404 for execution. For example, the instructions may initially be borne on a magnetic disk of a remote computer. The remote computer can load the instructions into its dynamic memory and send the instructions over a telephone line using a modem. A modem local to computer system 400 can receive the data on the telephone line and use an infrared transmitter to convert the data to an infrared signal. An infrared detector coupled to bus 402 can receive the data carried in the infrared signal and place the data on bus 402. Bus 402 carries the data to main memory 406, from which processor 404 retrieves and executes the instructions. The instructions received by main memory 406 may optionally be stored on storage device 410 either before or after execution by processor 404.

Computer system 400 also preferably includes a communication interface 418 coupled to bus 402. Communication interface 418 provides a two-way data communication coupling to a network link 420 that is connected to a local network 422. For example, communication interface 418 may be an integrated services digital network (ISDN) card or a modem to provide a data communication connection to a corresponding type of telephone line. As another example, communication interface 418 may be a local area network (LAN) card to provide a data communication connection to a compatible LAN. Wireless links may also be implemented. In any such implementation, communication interface 418 sends and receives electrical, electromagnetic or optical signals that carry digital data streams representing various types of information.

Network link 420 typically provides data communication through one or more networks to other data devices. For example, network link 420 may provide a connection through local network 422 to a host computer 424 or to data equipment operated by an Internet Service Provider (ISP) 426. ISP 426 in turn provides data communication services through the worldwide packet data communication network, now commonly referred to as the "Internet" 428. Local network 422 and Internet 428 both use electrical, electromagnetic or optical signals that carry digital data streams. The signals through the various networks and the signals on network link 420 and through communication interface 418, which carry the digital data to and from computer system 400, are exemplary forms of carrier waves transporting the information.

Computer system 400 can send messages and receive data, including program code, through the network(s), network link 420, and communication interface 418. In the Internet example, a server 430 might transmit a requested code for an application program through Internet 428, ISP 426, local network 422 and communication interface 418. In some embodiments, one such downloaded application provides for the test pattern selection of the embodiment, for example. The received code may be executed by processor 404 as it is received, and/or stored in storage device 410, or other non-volatile storage for later execution. In this manner, computer system 400 may obtain application code in the form of a carrier wave.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although the description provided above provides detail for the purpose of illustration based on what is currently considered to be the most practical and preferred embodiments, it is to be understood that such detail is solely for that purpose and that the disclosure is not limited to the expressly disclosed embodiments, but, on the contrary, is intended to cover modifications and equivalent arrangements that are within the spirit and scope of the appended claims. For example, it is to be understood that the present disclosure contemplates that, to the extent possible, one or more features of any embodiment can be combined with one or more features of any other embodiment. It is intended that the appended claims encompass such changes and modification.

What is claimed is:

1. A method for accelerating calibration of a fabrication process model, the method comprising performing one or more iterations of the following operations until a prediction by the fabrication process model related to a dimension of a metrology gauge is within a predetermined threshold of a dimension of the metrology gauge as measured on a post-fabrication process substrate:

defining one or more fabrication process model terms;

receiving predetermined information related to the one or more fabrication process model terms;

generating, by a hardware computer system, the fabrication process model based on the predetermined information, the fabrication process model configured to generate one or more predictions related to the metrology gauge; and determining whether a prediction related to a dimension of the metrology gauge is within a predetermined threshold of a dimension of the metrology gauge as previously measured on a post-fabrication process substrate.

2. The method of claim 1, wherein the fabrication process model comprises a resist model.

3. The method of claim 2, further comprising determining whether the prediction related to the dimension of the metrology gauge is within a predetermined threshold of the dimension of the metrology gauge as previously measured on a post-develop resist.

4. The method of claim 1, wherein the fabrication process model comprises an etch model.

5. The method of claim 1, wherein individual ones of the one or more fabrication process model terms comprise a coefficient corresponding to a standard deviation of a Gaussian vector, and wherein the predetermined information comprises a predetermined Gaussian blur applied to the standard deviation of the Gaussian vector.

6. The method of claim 1, further comprising determining an effect caused by a cross contribution of two or more fabrication process model terms by determining a product of the two or more fabrication process model terms.

7. The method of claim 6, wherein the fabrication process model comprises a resist model, wherein the resist model terms comprise loading and acid distribution in the resist, and wherein determining a cross contribution of loading and acid distribution in the resist comprises determining a product of resist model terms corresponding to the loading and the acid distribution.

8. The method of claim 1, wherein the metrology gauge corresponding to the metrology measurement includes a unique identification parameter, wherein the unique identification parameter is determined based on a fabrication process pattern and a predetermined fabrication processing ambit, wherein a fabrication process model optimization corresponding to the unique identification parameter is stored in a database, and wherein the method further comprises:

determining whether a unique identification parameter corresponding to a metrology gauge of a given fabrication process pattern exists in the database; and responsive to the unique identification parameter corresponding to the gauge of the given fabrication process pattern being present in the database, generating the fabrication process model using the fabrication process model optimization corresponding to the unique identification parameter.

9. The method of claim 1, further comprising determining a particular fabrication process term of the one or more fabrication process model terms that is more heavily weighted in the fabrication process model than the remaining fabrication process terms of the one or more fabrication process model terms.

10. The method of claim 1, further comprising determining one or more effects caused by one or more different fabrication process models, the determination including determining which effects commonly express prominence within each of the one or more different fabrication process models.

11. The method of claim 10, wherein the one or more different fabrication process models comprises one or more different resist models, and wherein the effect caused by the one or more different resist models includes resist shrinkage.

12. A computer program product comprising one or more non-transitory computer-readable storage media having computer-executable instructions therein, the instructions, upon execution by a computer system, configured to cause the computer system to at least:

perform one or more iterations of the following operations until a prediction by a fabrication process model related to a dimension of a metrology gauge is within a predetermined threshold of a dimension of the metrology gauge as measured on a post-fabrication process substrate:

define one or more fabrication process model terms;

receive predetermined information related to the one or more fabrication process model terms;

generate the fabrication process model based on the predetermined information, the fabrication process model configured to generate one or more predictions related to the metrology gauge; and determine whether a prediction related to a dimension of the metrology gauge is within a predetermined threshold of a dimension of the metrology gauge as previously measured on a post-fabrication process substrate.

13. The computer program product of claim 12, wherein individual ones of the one or more fabrication process model terms comprise a coefficient corresponding to a standard deviation of a Gaussian vector, and wherein the predetermined information comprises a predetermined Gaussian blur applied to the standard deviation of the Gaussian vector.

14. The computer program product of claim 12, wherein the instructions are further configured to cause the computer system to determine an effect caused by a cross contribution of two or more fabrication process model terms by determining a product of the two or more fabrication process model terms.

15. The computer program product of claim 14, wherein the fabrication process model comprises a resist model, wherein the resist model terms comprise loading and acid distribution in the resist, and wherein determination of a cross contribution of loading and acid distribution in the resist comprises determination of a product of resist model terms corresponding to the loading and the acid distribution.

16. The computer program product of claim 12, wherein the metrology gauge corresponding to the metrology measurement includes a unique identification parameter, wherein the unique identification parameter is determined based on a fabrication process pattern and a predetermined fabrication processing ambit, wherein a fabrication process model optimization corresponding to the unique identification parameter is stored in a database, and wherein the instructions are further configured to cause the computer system to:

determine whether a unique identification parameter corresponding to a metrology gauge of a given fabrication process pattern exists in the database; and responsive to the unique identification parameter corresponding to the gauge of the given fabrication process pattern being present in the database, generate the fabrication process model using the fabrication process model optimization corresponding to the unique identification parameter.

17. The computer program product of claim 12, wherein the instructions are further configured to cause the computer system to determine a particular fabrication process term of the one or more fabrication process model terms that is more heavily weighted in the fabrication process model than the remaining fabrication process terms of the one or more fabrication process model terms.

18. The computer program product of claim 12, wherein the instructions are further configured to cause the computer system to determine one or more effects caused by one or more different fabrication process models, the determination including determination of which effects commonly express prominence within each of the one or more different fabrication process models.

19. A system for accelerating calibration of a fabrication process model, the system comprising:

one or more processors configured by machine-readable instructions to perform one or more iterations of the following operations until a prediction by the fabrication process model related to a dimension of a metrology gauge is within a predetermined threshold of a dimension of the metrology gauge as measured on a post-fabrication process substrate:

define one or more fabrication process model terms;

receive predetermined information related to the one or more fabrication process model terms;

generate the fabrication process model based on the predetermined information, the fabrication process model configured to generate one or more predictions related to the metrology gauge; and determine whether a prediction related to a dimension of the metrology gauge is within a predetermined threshold of a dimension of the metrology gauge as previously measured on a post-fabrication process substrate.

20. The system of claim 19, wherein the predetermined information comprises pre-calculated signals indicative of one or more physical and/or chemical characteristics of the fabrication process.

* * * * *